United States Patent [19]

Westwick et al.

[11] Patent Number: 4,636,738

[45] Date of Patent: Jan. 13, 1987

[54] PARASITIC COMPENSATED SWITCHED CAPACITOR INTEGRATOR

[75] Inventors: Alan L. Westwick, Austin; Roger A. Whatley, Georgetown, both of Tex.

[73] Assignee: Motorola, Inc., Schaumburg, Ill.

[21] Appl. No.: 825,373

[22] Filed: Feb. 3, 1986

[51] Int. Cl.[4] .................................... H03F 1/08

[52] U.S. Cl. .................................... 330/9; 328/127; 330/51; 330/107; 333/173

[58] Field of Search .................... 330/9, 51, 149, 107, 330/109, 294; 307/520; 333/173; 328/127, 167

[56] References Cited

U.S. PATENT DOCUMENTS 4,565,971 1/1986 Brookshire .............................. 330/9

*Primary Examiner*—James B. Mullins

*Attorney, Agent, or Firm*—John Fisher; Jeffrey Van Myers; Robert L. King

[57] ABSTRACT

A switched capacitor integrator for receiving a single input signal is compensated for parasitic capacitance errors with a minimum amount of circuitry. Although a single-ended amplifier is provided, a differential amplifier input is used which receives equal amounts of parasitic charge to effectively cancel charge errors. The size of the compensating capacitive circuitry may be reduced by making the input parasitic capacitance at one of the inputs proportionately larger so that the noise gain in both positive and negative signal paths remains substantially the same.

5 Claims, 3 Drawing Figures

PARASITIC COMPENSATED SWITCHED CAPACITOR INTEGRATOR

TECHNICAL FIELD

This invention relates generally to integrator circuits, and more particularly, to switched capacitor integrator circuits which are compensated for error voltages.

BACKGROUND ART

Switched capacitor integrators are widely used and a known problem with such circuits is the existence of output voltage errors resulting from charge injection by parasitic capacitances. Parasitic capacitance is associated with the inputs of an integrating amplifier and may exist from a variety of sources. A common source of parasitics is a conventional transistor switch known as a transmission gate wherein two transistors of complementary conductivity are coupled in parallel and controlled or clocked by complementary signals. Such parasitics results from gate-drain and gate-source overlap capacitances and drain-substrate and source-substrate junction capacitances. Other have attempted to minimize parasitics associated with transistor switches by adding compensating circuitry to the switches which often require at least one of additional control signals, additional circuitry or additional fabrication processing steps. Others have used transistor switches having a single transistor which is compensated for parasitic capacitance. However, typical single transistor switches when compensated have a high impedance when made conductive at low power supply voltages which degrades circuit performance. Regardless of the effectiveness of minimizing error charge injected into an amplifier by transistor switches, other errors result from parasitics existing between input nodes and noise sources such as power supplies and other signal lines. An example of a switched capacitor circuit which is compensated for stray capacitance errors is taught by Temes et al. in U.S. Pat. No. 4,543,534 entitled "Offset Compensated Switched Capacitor Circuits". A differential amplifier structure is taught by Temes et al. which has the known advantage of superior power supply rejection compared to single input differential amplifier. A disadvantage with differential amplifier structures and associated compensating circuitry is the large amount of circuitry typically required.

BRIEF DESCRIPTION OF THE INVENTION

Accordingly, an object of the present invention is to provide an improved switched capacitor integrator circuit which is compensated for parasitic capacitances.

Another object of the present invention is to provide an improved switched capacitor input structure for differential input amplifiers.

A further object of the present invention is to provide an improved circuit for minimizing error voltages in switched capacitor amplifier circuits.

Yet another object of the present invention is to provide an improved method for minimizing output voltage errors resulting from parasitic capacitance in a switched capacitor integrator.

In carrying out the above and other objects of the present invention, there is provided, in one form, a differential amplifier having first and second inputs and an output for providing an output signal proportional to a differential between first and second input voltage potentials coupled to the first and second inputs, respectively. A feedback capacitor is coupled between the first input and the output of the differential amplifier and has a first capacitive value. A switched input capacitor has a first electrode coupled to a single input voltage and a second electrode alternately coupled between the first input of the differential amplifier and a reference voltage terminal via a first pair of switches. A compensation capacitor is coupled between the second input of the differential amplifier and the reference voltage terminal. The compensation capacitor has a second capacitive value which is ratioed to be substantially equal to (1/N)th of the first capacitive value, where N is an integer. A discharge capacitor is provided for selectively discharging the compensation capacitor and has a first electrode coupled to the reference voltage terminal. A second electrode of the discharge capacitor is alternatively coupled between the charge compnesation capacitor and the reference voltage terminal via a second pair of swtiches. To compensate for error voltages, an equal amount of error charge is coupled to each input of the differential amplifier. The compensation is achieved by coupling substantially N addition pairs of switches in parallel with the first pair of switches.

These and other objects, features and advantages will be more clearly understood from the following detailed description taken in conjunction with the accompanying drawings.

DETAILED DESCRIPTION OF THE INVENTION

Figure 1:
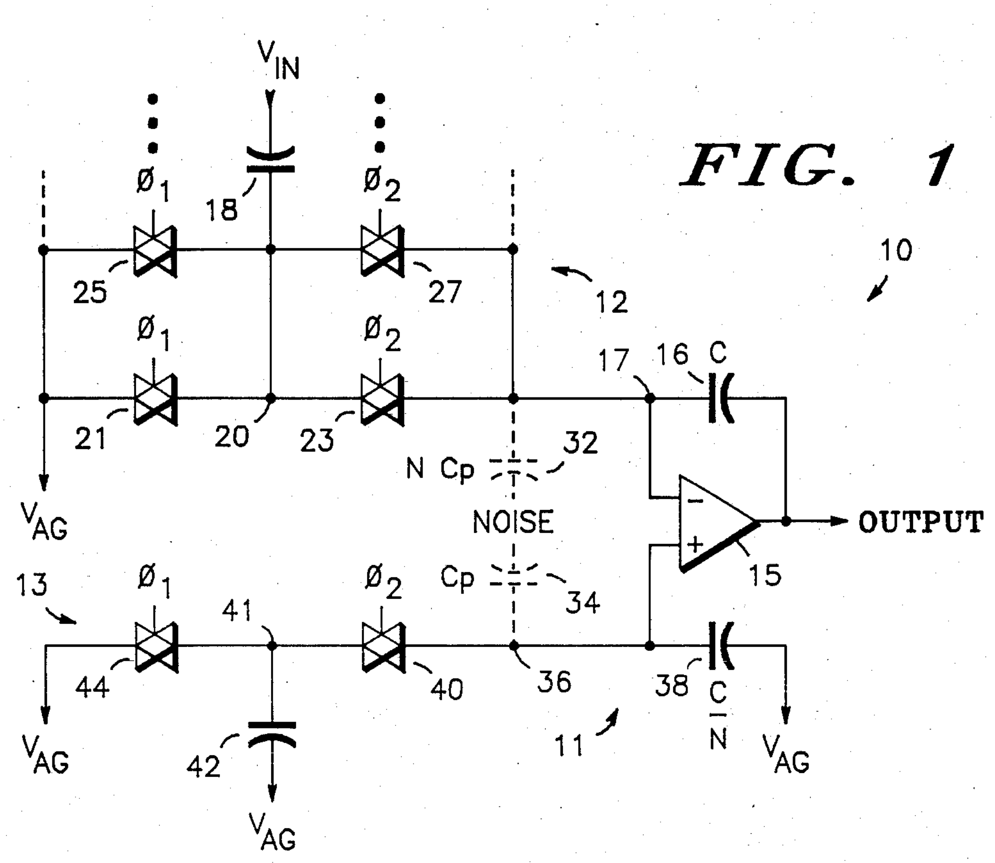
FIG. 1 illustrates in schematic form a switched capacitor integrator in accordance with the present invention.
Figure 2:
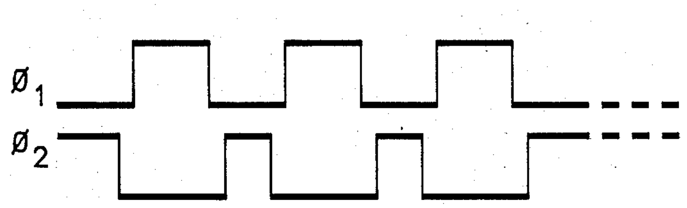
FIG. 2 illustrates in graphical form control signals associated with the circuit of FIG. 1.

Shown in FIG. 1 is a switched capacitor integrator 10 generally comprising an integrator portion 11, a first input portion 12 and a second input portion 13. It should be readily understood that the present invention may be practiced by implementing integrator 10 with any type of switches to be described below.

Integrator portion 11 has a differential amplifier 15 with a negative or inverting input connected to a first electrode of a capacitor 16 at a node 17. A second electrode of capacitor 16 is connected to an output of amplifier 15 for providing an output voltage. Capacitor 16 is illustrated having a capacitive value "C". Differential amplifier 15 also has a positive or non-inverting input.

First input portion 12 has a capacitor 18 having a first electrode for receiving an input voltage labeled $V_{IN}$. A second electrode of capacitor 18 is connected to a node 20. A first terminal of a switch 21 is connected to node 20, and a second terminal of switch 21 is connected to an analog ground terminal labeled $V_{AG}$. A control terminal of switch 21 is coupled to a control signal labeled $\phi_1$. A switch 23 has a first terminal connected to node 20 and a second terminal connected to node 17. A control terminal of switch 23 is coupled to a control signal labeled $\phi_2$. A switch 25 has a first terminal connected to node 20 and a second terminal connected to the analog ground terminal. A control terminal of switch 25 is coupled to control signal $\phi_1$. A switch 27 has a first terminal connected to node 20 and a second terminal connected to node 17. A control terminal of switch 27 is coupled to control signal $\phi_2$. A plurality of additional pairs of switches may be coupled to nodes 17 and 20 and the analog ground terminal in an analagous manner as shown by the extended lines in FIG. 1. The total number of pairs of switches connected in this manner is N, where N is an integer.

In the illustrated form, parasitic capacitance from various sources which are coupled to node 17 is illustrated by a dashed line leading to a capacitor 32 having a capacitive value labeled "$C_p$". The source of charge injection onto parasitic capacitor 32 is represented generally as "noise". Similarly, a capacitor 34 represents parasitic capacitance, also labeled "$C_p$", associated with a node 36 which is connected to the positive input of differential amplifier 15.

Second input portion 13 has a capacitor 38 having a first electrode connected to node 36 and a second electrode connected to the analog ground terminal. The capacitive value of capacitor 38 is represented by "C/N". A switch 40 has a first terminal connected to node 36 and a second terminal connected to a node 41. A control terminal of switch 40 is coupled to control signal $\phi_2$. A first electrode of a capacitor 42 is connected to node 41, and a second electrode of capacitor 42 is connected to the analog ground terminal. A first terminal of a switch 44 is connected to node 41, and a second electrode of switch 44 is connected to the analog ground terminal. A control terminal of switch 44 is coupled to control signal $\phi_1$.

In operation, an input voltage is coupled to integrator 10 and stored on input capacitor 18 during the time when control signal $\phi_1$ makes switches 21 and 25 conductive. Switches 23 and 27 are nonconductive. After an input voltage is charged onto capacitor 18, switches 21 and 25 become nonconductive and switches 23 and 27 become conductive so that the input voltage is coupled to the negative input of differential amplifier 15 and charge shared onto feedback capacitor 16. Differential amplifier 15 and feedback capacitor 16 function in a conventional manner to integrate the value of input voltage and provide an output voltage representing the integral of the input voltage. The output voltage is susceptible to error from parasitic charge being injected into node 17 from various sources. Switches 21 and 23 have parasitics associated therewith which couple an error charge to node 20 which is further coupled to node 17 when signal $\phi_2$ makes switch 23 conductive. Other parasitics associated with nodes 20 and 17 are charge coupled from various noise sources such as the power supply for differential amplifier 15 and high frequency radiated energy. The total parasitic capacitance which is coupled into the negative input of differential amplifier 15 from all the various sources is illustrated by parasitic capacitor 32 in FIG. 1. To reduce and substantially eliminate the error voltage caused by parasitic capacitor 32, an equal amount of parasitic capacitance can be coupled to the positive input of differential amplifier 15 at node 36. This is the distinct advantage a differential input amplifier structure has over a single input amplifier structure which cannot be compensated for parasitics as effectively. To accomplish the error cancellation, compensating circuitry is coupled to the positive input of differential amplifier 15. Since the parasitic producing circuitry which is coupled to node 17 is switch 21, switch 23 and feedback capacitor 16, these same devices should also be coupled to node 36 in the form of switch 44, switch 40 and capacitor 38, respectively. However, the value of feedback capacitor 16 is typically large in value and size in most amplifier applications. Therefore, it is undesireable to replicate an identical capacitor having the size of the feedback capacitor in the circuit solely for purposes of error charge cancellation. The present invention differs from prior art circuits by substantially reducing the size of circuitry required to effect equal parasitic charge coupling at each input of a differential input amplifier structure.

In the illustrated form, compensation capacitor 38 is size ratioed with feedback capacitor 16 to be an integer, N, fractional amount of the capacitance feedback capacitor 16. To understand how an equal parasitic compensating charge can be coupled to the positive input of differential amplifier 15 when the capacitive value which is correlated with the feedback capacitance contribution is made much smaller than the value actually coupled to the negative input, an examination of the noise gain equations associated with amplifier 15 must be made.

Figure 3:
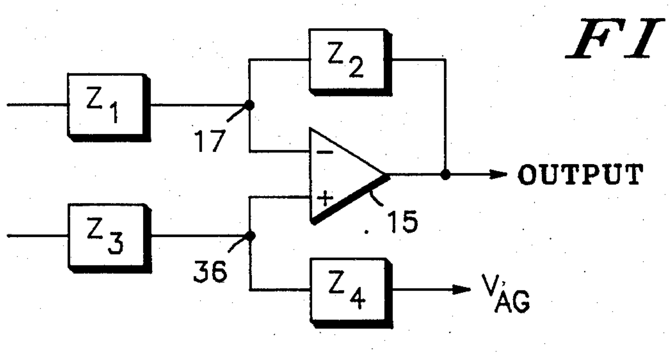
FIG. 3 illustrates in block diagram form an impedance equivalent circuit of the integrator of FIG. 1.

Shown in FIG. 3 is an equivalent circuit of the impedance associated with integrator 10 of FIG. 1. The effective impedance of parasitic capacitor 32 coupled to node 17 is represented by the value Z1. The impedance of feedback capacitor 16 is represented by the value Z2. Similarly, the effective impedance of parasitic capacitor 34 coupled to node 36 is represented by Z3 and the impedance of compensation capacitor 38 is represented by Z4. It can be readily shown that the noise gain of integrator 10 in the negative signal path may be represented by:

$$A(-) = -(Z2/Z1) \tag{1}$$

The noise gain of integrator 10 in the positive signal path may be readily shown to be:

$$A(+) = [Z4/(Z3+Z4)][(Z1+Z2)/Z1)] \tag{2}$$

Since the noise gain in both signal paths must be equal for all parasitic error to be cancelled, the noise gain in the positive path when the impedance of capacitor 38 is selected as [1/(C/N)] can readily be shown to be the following.

$$A(+) = (NC_p/C) \tag{3}$$

Since the noise gains of both signal paths must be matched, impedance Z1 in equation (1) must be changed since impedance Z2 is fixed at (1/C). When solving for Z1 in equation (1) it can be readily shown that Z1 must equal the following.

$$Z1 = (1/NC_p) \tag{4}$$

Therefore, the value of parasitic capacitor 32 must be equal to $NC_p$ if compensation capacitor 38 has a value of (1/N)th the capacitance C of feedback capacitor 16. In order to increase the parasitic capacitance at node 17 by a factor of N, an additional N pairs of switches such as switches 21 and 23 may be coupled in parallel with switches 21 and 23. The addition of N pairs of additional switches to increase the capacitor 32 by a factor of N may be further understood by realizing that the parasitic contribution of switches 21 and 23 to node 17 is a fixed amount with respect to the contribution of capacitor 16. Therefore, the parasitic capacitance at node 17 is directly proportional to the number of switches coupled to node 17. The amount of parasitic contribution from each switch has been assumed to be the same which is an accurate assumption for conventional integrated circuit processes. The size of a pair of additional switches is much smaller than the amount of circuit space required to replicate the full value of capacitance C by compensation capacitor 38. As a result, a very accurate parasitic compensation method has been taught which uses much less circuitry and circuit area than previous techniques.

In order to prevent compensation capacitor 38 from becoming charged to a voltage corresponding to a charge greater than the actual error charge being corrected for, capacitor 38 is periodically discharged by the use of discharge capacitor 42. The discharging is effected by charge sharing capacitor 42 with the charge on capacitor 38 during the time switch 40 is conductive. When switch 40 is nonconductive and switch 44 is conductive, capacitor 42 is fully discharged. In this manner, capacitor 42 can constantly pull enough charge off of compensation capacitor 38 to insure that capacitor 38 never becomes overly charged. This circuit operation is an inherent feature in the invention since switches 40 and 44 must be present in the positive noise path to match swtiches 23 and 21 for compensation purposes anyway. It should be readily understood that the present invention may be practised without actually having capacitor 42 physically implemented as a capacitor. In actuality, the parasitic capacitance present at node 36 may be enough capacitance to charge share the compensating charge with capacitor 38 and keep capacitor 38 discharged to a proper level to function accurately. In such a case, the claimed discharge capacitor or capacitance means found in the claims appended hereto is intended to only describe parasitic capacitance. If capacitor 42 is physically implemented with a capacitor other than the naturally existing parasitic capacitance at node 36, the actual capacitive value may be made very small.

As a variation of the present invention, it should be readily apparent that the present invention may be implemented with any of many known input switching structures (not shown) other than the structure of switches 21 and 23 illustrated in FIG. 1. In such a case, N additional structures identical to such other possible switching structures would be coupled in the manner taught herein to the inputs of differential amplifier 15.

By now it should be apparent that a switched capacitor integrator which is fully compensated for parasitic errors with a minimum amount of compensating circuitry has been provided. The integrator structure is effectively only a single ended input structure requiring only a single input signal but utilizes the compensation advantages of a fully differential input structure. Although the present invention relates to single-ended input amplifier applications, the invention provides power supply rejection which is as excellent as a differential input structure. As a result, much less circuit area is required to implement this invention than previous compensated fully differential switched capacitor structures.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. In a parasitic compensated switched capacitor integrator for integrating a single input voltage comprising:

a differential amplifier with first and second inputs and an output, for providing an output signal proportional to a differential between first and second input voltage potentials coupled to the first and second inputs, respectively;

feedback capacitance means coupled between the first input and the output of the differential amplifier means and having a first predetermined capacitive value;

switched input capacitance means having an input capacitor with a first electrode coupled to a first voltage terminal and a second electrode;

first switching means coupled to the second electrode of the switched input capacitance means for alternately coupling the input capacitance means between the first input of the differential amplifier and a second voltage terminal, the improvement comprising:

charge compensation means connected between the second input of the differential amplifier and said second voltage terminal, said charge compensation means having a second capacitive value substantially equal to (1/N)th of the first capacitive value, where N is an integer;

discharge means coupled between the second voltage terminal and the charge compensation means, for selectively discharging the charge compensation means; and second switching means coupled to the first switching means, said second switching means performing substantially the same function as the first switching means and increasing the parasitic capacitance coupled to the first input of the differential amplifier substantially N times.

2. In a parasitic compensated switched capacitor integrator for integrating a single input voltage comprising:

a differential amplifier with first and second inputs and an output, for providing an output signal proportional to a differential between first and second input voltage potential coupled to the first and second inputs, respectively;

feedback capacitance means coupled between the first input and the output of the differential amplifier means having a first predetermined capacitive value; and switched input capacitance means having an input capacitor with a first electrode for receiving the input voltage and a second electrode;

a first pair of switches for alternately coupling the second electrode of the input capacitance means between the first input of the differential amplifier and a reference voltage terminal, the improvement comprising:

charge compensation means connected between the second input of the differential amplifier and said reference voltage terminal, said charge compensation means having a second capacitive value substantially equal to (1/N)th of the first capacitive value, where N is an integer;

discharge means having a discharge capacitor with a first electrode coupled to the reference voltage terminal and a second electrode alternately coupled between the charge compensation means and the reference voltage terminal via a second pair of switches; and N additional pairs of switches coupled in parallel with the first pair of switches.

3. The switched capacitor integrator of claim 2 wherein each pair of switches comprises two MOS transmission gate switches clocked by nonoverlappig clock signals.

4. A method of minimizing error voltages in a switched capacitor integrator resulting from parasitic charge injection at each of differential inputs of a differential amplifier of the integrator having a feedback capacitor with a first capacitive value coupled from an output thereof to a first input, comprising the steps of:

providing an input capacitor having a first electrode for receiving an input voltage and a second electrode altenately coupled between the first input of the differential amplifier and a reference voltage terminal via a first pair of switches;

coupling a compensating capacitor with a second capacitive value between a second input of the differential amplifier and the reference voltage terminal;

rotioing the first capacitive value to be substantially N times greater than the second capacitive value, where N is an integer;

coupling discharge means to be compensating capacitor, said discharge means comprising a discharge capacitor having a first electrode coupled to the reference voltage terminal and a second electrode alternately coupled to the reference voltage terminal and the compensating capacitor via a second pair of switches; and coupling substantially N additional pairs of switches in parallel with the first pair of switches.

5. A parasitic compensated switched capacitor integrator circuit comprising:

a differential amplifier having a first input, a second input and an output, for providing an output voltage proportional to a differential in voltage potential between the first and second inputs thereof;

a feedback capacitor having a first electrode coupled to the first input of the differential amplifier and a second electrode coupled to the output of the differential amplifier, said feedback capacitor having a first capacitive value;

an input capacitor having a first electrode for receiving an input signal and a second electrode;

a first pair of switches coupled to the second electrode of the input capacitor, for alternately coupling the input capacitor to a reference voltage terminal and the first input of the differential amplifier;

a compensation capacitor having a first electrode coupled to the second input of the differential amplifier and a second electrode coupled to the reference voltage terminal, said compensation capacitor having a second capacitive value which is ratioed to the input capacitor wherein the second capacitive value is substantially (1/N)th the first capacitive value, where N is an integer;

a discharge capacitor having a first electrode coupled to the reference voltage terminal and a second electrode;

a second pair of switches coupled to the discharge capacitor for alternately coupling the second electrode of the discharge capacitor to the first electrode of the compensation capacitor and the reference voltage terminal; and N additional pairs of switches coupled in parallel to the first pair of switches.

* * * * *

UNITED STATES PATENT AND TRADEMARK OFFICE

CERTIFICATE OF CORRECTION

PATENT NO. : 4,636,738

DATED : 13 January 1987

INVENTOR(S) : Alan L. Westwick et al

It is certified that error appears in the above-identified patent and that said Letters Patent is hereby corrected as shown below:

In claim 2, column 6, line 47, change "potential" to --potentials--.

In claim 4, column 7, at line 19, change "altenately" to --alternately--; at line 26, change "rotioing" to --ratioing--; and at line 29, change "be" to --the--.

Signed and Sealed this

Thirty-first Day of March, 1987

*Attest:*

DONALD J. QUIGG

*Attesting Officer*

*Commissioner of Patents and Trademarks*